United States Patent [19]
Mar

[11] Patent Number: 5,892,383
[45] Date of Patent: *Apr. 6, 1999

[54] PARALLEL VOLTAGE CONTROLLED RESISTANCE ELEMENTS

[75] Inventor: Monte F. Mar, Beaverton, Oreg.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 718,646

[22] Filed: Sep. 27, 1996

Related U.S. Application Data

[63] Continuation of Ser. No. 490,331, Jun. 13, 1995, abandoned.

[51] Int. Cl.$^6$ ........................................................ H03K 5/13
[52] U.S. Cl. ............................ 327/276; 327/281; 327/158
[58] Field of Search ..................................... 327/269, 270, 327/274, 276, 199, 153, 158, 161, 272, 271, 277, 278, 280, 281, 285, 288, 287; 331/57

[56] References Cited

U.S. PATENT DOCUMENTS

| | | | |
|---|---|---|---|
| 4,820,943 | 4/1989 | Makino et al. | 327/277 |
| 4,905,192 | 2/1990 | Nogami et al. | 365/200 |
| 5,012,141 | 4/1991 | Tomisawa | 327/276 |
| 5,111,085 | 5/1992 | Stewart | 327/278 |
| 5,121,014 | 6/1992 | Huang | 327/276 |
| 5,179,303 | 1/1993 | Searles et al. | 327/277 |
| 5,343,099 | 8/1994 | Schichinohe | 327/374 |
| 5,428,311 | 6/1995 | McClure | 327/276 |
| 5,440,260 | 8/1995 | Hayashi et al. | 327/278 |
| 5,446,417 | 8/1995 | Korhonen et al. | 327/276 |
| 5,506,534 | 4/1996 | Guo et al. | 327/276 |

FOREIGN PATENT DOCUMENTS

| | | | |
|---|---|---|---|
| 536689 | 4/1993 | European Pat. Off. | 327/276 |
| 639003 | 2/1995 | European Pat. Off. | 327/276 |
| 1183147 | 7/1989 | Japan | 331/57 |
| 4135311 | 5/1992 | Japan | 327/261 |

OTHER PUBLICATIONS

Kim, B., Helman, D.N., Gray, P.R.; "A 30MHz Hybrid Analog/Digital Clock Recovery Circuit in 2–um CMOS"; IEEE Journal of Solid–State Circuits; vol. 25; No. 6; Dec. 1990; pp. 1385–1394.

Maneatis, John G., Horowitz, M.A.; "TA 7.5: Precise Delay Generation Using Coupled Oscillators"; 1993 IEEE International Solid–State Circuits Conference; Feb. 25, 1993; pp. 118–119.

Moon, G., Zaghloul, M.E., Newcomb, R.W.; "an Enhancement–Mode MOS Voltage–Controlled Linear Resistor with Large Dynamic Range"; IEEE Transactions on Circuits and Systems; vol. 37; No. 10; Oct. 1990; pp. 1284–1288.

Shariatdoust, R., Nagaraj, K., Saniski, M., Plany, J.; "A Low Jitter 5 MHz to 180 MHz Clock Synthesizer for Video Graphics"; 1992 IEEE Custom Integrated Circuits Conference; pp. 24.2.1–24.2.5.

Young, I.A., Greason, J. K., Wong, K.L.; "A PLL Clock Generator with 5 to 110 MHz of Lock Range for Microprocessors"; IEEE Journal of Solid–State Circuits; vol. 27; No. 11; Nov. 1992; pp. 1599–1606.

*Primary Examiner*—Timothy P. Callahan
*Assistant Examiner*—Eunja Shin
*Attorney, Agent, or Firm*—Blakely, Sokoloff, Taylor & Zafman LLP

[57] ABSTRACT

Two voltage controlled resistance elements are coupled together in parallel. The first voltage controlled resistance element is coupled to a first voltage input, a voltage source, and an output. The second voltage controlled resistance element is coupled to a second voltage input, the voltage source, the first voltage controlled resistance element, and the output. The parallel resistance elements provide a variable resistance based on the resistance values of the first and second voltage controlled resistance elements.

6 Claims, 5 Drawing Sheets

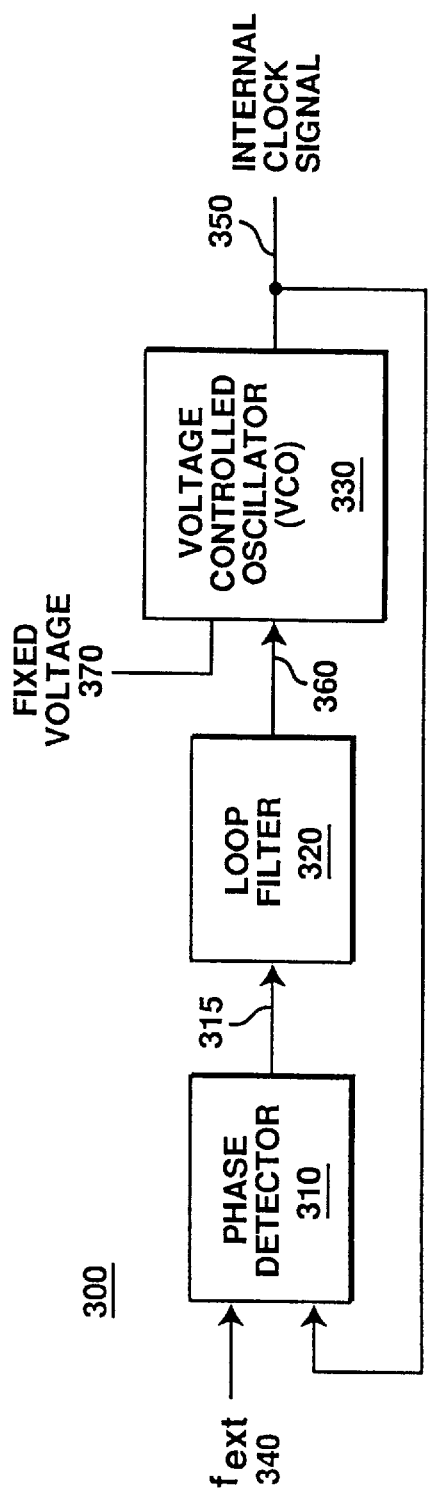

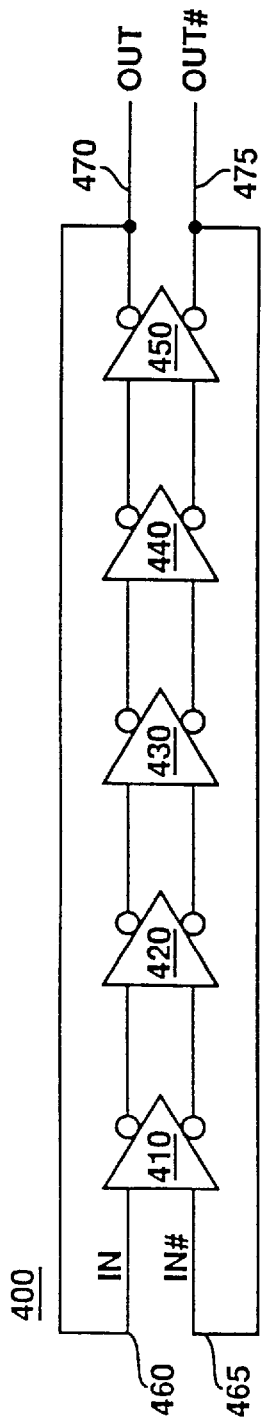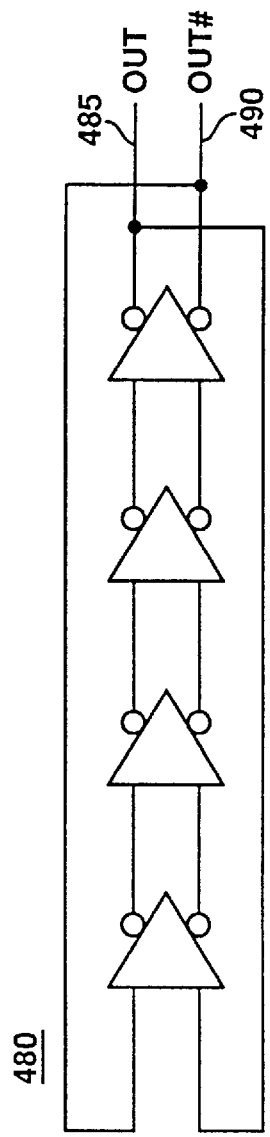
FIGURE 4a
FIGURE 4b

PARALLEL VOLTAGE CONTROLLED RESISTANCE ELEMENTS

This is a continuation of application Ser. No. 08/490,331, filed Jun. 13, 1995, now abandoned.

BACKGROUND OF THE INVENTION

1. Field of the Invention

The present invention pertains to the field of circuit design. More particularly, this invention relates to voltage controlled resistors.

2. Background

A voltage controlled resistor (VCR) is a circuit which provides a variable resistance based on a voltage input. VCRs can be used in a wide variety of analog and digital applications. One advantage to VCRs is that a single VCR can be used to provide a range of resistances, thereby allowing system designers a great deal of flexibility.

One use for VCRs is in microprocessors and other synchronous integrated circuit (IC) devices. These synchronous devices typically depend on a clock signal to operate. The clock signal provides a control signal so that the components within the device can perform their functions in a synchronized manner. Typically, these synchronous devices require a constant clock signal in order to operate properly. Without an adequate and constant clock signal, these devices operate either significantly below their potential or not at all. Thus, it would be beneficial to provide a circuit which provides a constant clock signal.

Additionally, different devices require clock signals of different frequencies. These different frequency requirements are due to a wide variety of factors, including the maximum operating speed of components within the device, the maximum operating speed of other devices which are to be coupled to this device, desired power dissipation of the device, the maximum desired operating temperature of the device, etc. Building separate clock generators which operate at each of these different frequencies, however, has several disadvantages. One such disadvantage is the actual building and maintaining of a large number of clock generating devices. A different design is used for each of the different clock generating devices, which results in a different fabrication process as well. Another disadvantage is ensuring that a supply of the proper frequency generators is available for those who need them, while at the same time not having a supply that greatly exceeds the demand. Thus, it would be beneficial to provide a single controllable clock signal generating device which can be adjusted to generate a wide range of frequencies.

One method which has been used to generate a clock signal uses a phase locked loop including a voltage controlled oscillator. The voltage controlled oscillator includes multiple delay stages which include a voltage controlled resistance. The voltage controlled resistance uses a single voltage control input to adjust the resistance of the delay stage. The higher the resistance of the delay stage, the longer the delay imposed by the stage. And, the longer the delay imposed by the stage, the lower the frequency of oscillation.

These voltage controlled resistances provide some control over the frequency of the clock signal being generated. One such voltage controlled resistance circuit is shown in FIG. 1. Circuit 100 of FIG. 1 includes a control input voltage 110 which controls the current at output 120. The larger the control input voltage 110, the greater the current at output 120. Thus, increasing the input voltage decreases the resistance of circuit 100. FIG. 2 is a graph showing the I–V characteristic of the circuit of FIG. 1 at output 120 for control input voltages of 3 v, 2 v, and 1.5 v. As shown in FIG. 2, larger control input voltages can provide larger output currents. Therefore, by changing the control input voltage, the delay stages of the oscillator can provide different resistances, which results in a range of clock frequencies which can be generated.

Larger control input voltages are necessary in FIG. 1 to obtain the largest range of resistances. However, circuit 100 is also very susceptible to noise in the voltage control input line at the larger control input voltages. That is, slight changes in the input control voltage line can result in noticeable changes in the output current. Thus, the frequency of the oscillator can be noticeably affected by slight changes in the input control voltage. Such susceptibility to noise is undesirable in a clock generator because it provides a changing clock signal rather than a constant clock signal. Thus, it would be beneficial to provide a delay stage for a voltage controlled oscillator which reduces the impact that noise in the voltage input line has on the output frequency, while at the same time maintaining a wide range of frequencies.

The present invention provides for these and other advantageous results.

SUMMARY OF THE INVENTION

The present invention includes two voltage controlled resistance elements which are coupled together in parallel. The first voltage controlled resistance element is coupled to a first voltage input, a voltage source, and an output. The second voltage controlled resistance element is coupled to a second voltage input, the voltage source, the first voltage controlled resistance element, and the output. The parallel resistance elements provide a variable resistance based on the resistance values of the first and second voltage controlled resistance elements.

BRIEF DESCRIPTION OF THE DRAWINGS

The present invention is illustrated by way of example and not limitation in the figures of the accompanying drawings, in which like references indicate similar elements and in which:

FIG. 3 is block diagram of a phase locked loop according to one embodiment of the present invention;

FIG. 4A is a block diagram of a voltage controlled oscillator according to one embodiment of the present invention;

FIG. 4B is a block diagram of a voltage controlled oscillator according to an alternate embodiment of the present invention;

DETAILED DESCRIPTION

Figure 1:
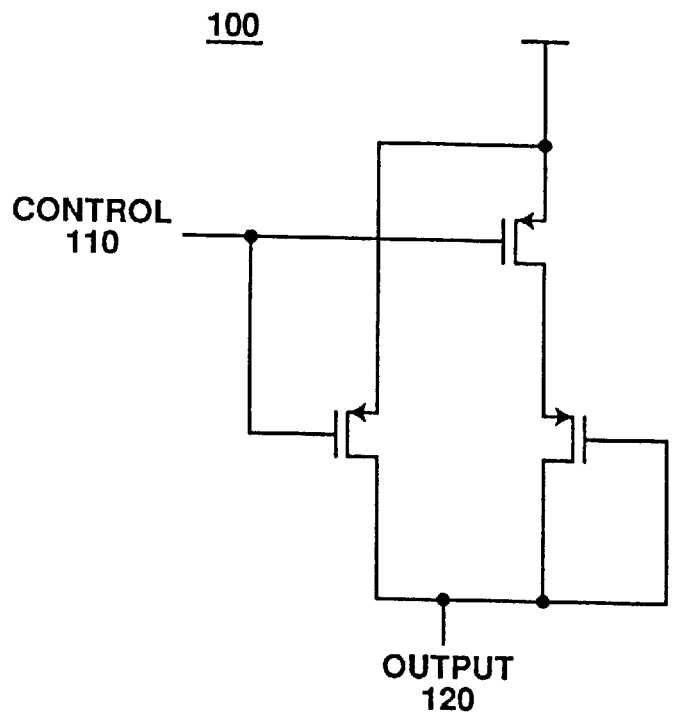
FIG. 1 is a diagram of a prior art voltage controlled resistance circuit.
Figure 2:
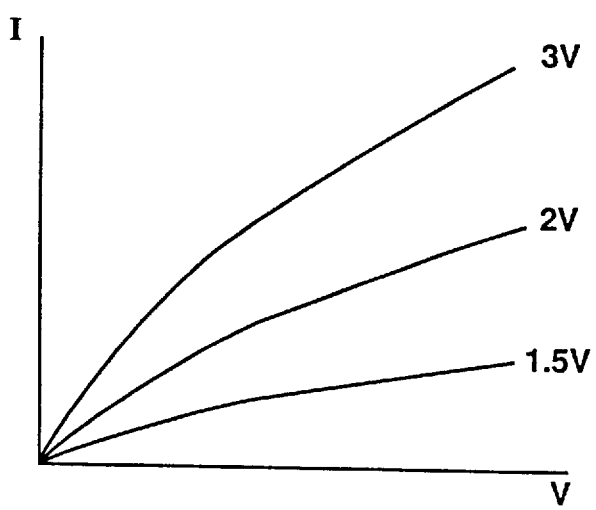
FIG. 2 is a graph showing the I–V characteristic of the circuit of FIG. 1.

In the following detailed description numerous specific details are set forth in order to provide a thorough understanding of the present invention. However, it will be understood by those skilled in the art that the present invention may be practiced without these specific details. In other instances, well known methods, procedures, components, and circuits have not been described in detail so as not to obscure aspects of the present invention.

In the descriptions which follow, reference is made to logical zeroes and logical ones. A logical zero typically represents a voltage of between 0.0 and 0.5 volts. When a particular signal or node is a logical zero, the signal or node is referred to as being low or in a low state. A logical one typically represents a voltage of between 2.5 and 5.5 volts. When a particular signal or node is a logical one, the signal or node is referred to as being high or in a high state. It is to be appreciated, however, that the voltages which represent a logical zero or a logical one can be different than the ranges mentioned herein.

Also in the descriptions which follow, reference is made to signals and inverted signals. An inverted signal herein refers to the logical opposite of a signal. For example, if a particular signal is a logical one, then the inversion of that signal is a logical zero. Analogously, if a particular signal is a logical zero, then the inversion of that signal is a logical one.

Metal-oxide semiconductor (MOS) transistors are also discussed in the descriptions which follow. A transistor is an electronic component which typically comprises two terminals (commonly referred to as source and drain) and a gate terminal. Two general types of transistors are typically used: p-channel transistors and n-channel transistors. In an n-channel transistor, current flows between the two terminals when greater than a threshold voltage is applied to the gate terminal (that is, the transistor is turned on). Generally, the greater the voltage, the greater the current flow between the terminals. If the voltage applied to the gate terminal is less than the threshold voltage, then current does not flow between the two terminals (that is, the transistor is turned off). Similarly, in a p-channel transistor, current does not flow between the two terminals when greater than a threshold voltage is applied to the gate terminal (that is, the transistor is turned off. Otherwise, current does flow between the two terminals (that is, the transistor is turned on). Generally, the lower the voltage, the greater the current flow between the terminals. Transistors are well-known to those skilled in the art and thus will not be described further.

FIG. 3 is a block diagram of a phase locked loop (PLL) 300 according to one embodiment of the present invention. PLL 300 includes a phase detector 310, a loop filter 320, and a voltage controlled oscillator (VCO) 330. PLL 300 can be used with any of a wide variety of conventional synchronous devices to, for example, provide a clock signal to the device(s). One benefit of PLL 300 is reducing clock skew between the external clock signal and the internal clock signal in a microprocessor.

Phase detector 310 receives two inputs: an external clock signal 340 and an internal clock signal 350. External clock signal 340 is input from an external device. In one embodiment, external clock signal 340 is a system clock which is also provided to other devices. Internal clock signal 350 is the oscillation being generated and output by VCO 330. Phase detector 310 operates in a conventional manner to compare the clock signals 340 and 350 and output pulses 315 based on the difference in phases of the two clock signals.

The pulses 315 output by phase detector 310 serve as inputs to loop filter 320. Loop filter 320 operates in a conventional manner to convert the pulses 315 to a voltage. Loop filter 320 then outputs this voltage as control voltage 360 to VCO 330. VCO 330 receives control voltage 360 from loop filter 320 and also receives a second input voltage 370. VCO 330 generates an oscillating output, which is internal clock signal 350. The frequency of clock signal 350 is dependent on control voltage 360 and input voltage 370, as discussed in more detail below. In one embodiment of the present invention, input voltage 370 is a fixed voltage source. In an alternate embodiment, input voltage 370 is a variable voltage source. For example, input voltage 370 could be varied by an external device, such as one which can be changed by a system designer or user.

Internal clock signal 350 is also returned and input to phase detector 310. Phase detector 310 then outputs different pulses 315, based on the difference between the new internal clock signal 350 and clock signal 340. This results in a new control voltage 360 being input to VCO 330, which results in a new internal clock signal 350. Each time internal clock signal 350 is changed, it gets closer to being the same as clock signal 340. This process of looping through PLL 300 continues until the internal clock signal 350 and the clock signal 340 are the same. When both signals 340 and 350 are the same, the pulses 315 output by phase detector 310 no longer change, which results in a constant voltage being input as control voltage 360.

Thus, PLL 300 locks into a particular frequency for internal clock signal 350. The range of frequencies which can be locked in is dependent on the fixed voltage 370 and the control voltage 360, as discussed in more detail below.

FIG. 4A shows a block diagram of a voltage controlled oscillator according to one embodiment of the present invention. Voltage controlled oscillators typically include multiple delay devices, also referred to as "delay stages". A voltage controlled oscillator generates an oscillating output having a frequency which is dependent on both the number of delay stages and the input voltage. The larger the number of delay stages, the lower the frequency of oscillation. Similarly, different input voltages affect the delay of each individual stage, as discussed in more detail below.

VCO 400 shown in FIG. 4A includes five delay stages: stage 410, stage 420, stage 430, stage 440, and stage 450. Each of the delay stages provides an output which is the logical inversion of the input signal it receives. That is, a delay stage outputs a logical one when it receives a logical zero as an input and outputs a logical zero when it receives a logical one as an input. The period of time taken to invert the input signal is dependent on the input voltage in a voltage controlled oscillator, as discussed in more detail below.

VCO 400 receives an input (IN) 460 and an inverted input (IN#) 465. VCO 400 inverts both IN 460 and IN# 465, and outputs an output signal (OUT) 470 and an inverted output signal (OUT#) 475. Given the odd number of delay stages in VCO 400, it can be seen that the output signal 470 is the logical inversion of input signal 460. Similarly, the inverted output signal 475 is the inversion of inverted input signal 465. Output signal 470 is coupled to input 460 and is thus input to stage 410 as IN 460. Similarly, inverted output signal 475 is coupled to inverted input 465 and is thus input to stage 410 as IN# 465. Thus, it can be seen that VCO 400 provides an oscillating output signal 470. VCO 400 also provides a second oscillating output signal 475, which is the inversion of output signal 470.

FIG. 4B is a block diagram of a VCO according to an alternate embodiment of the present invention. VCO 480 includes four delay stages, and outputs an output signal 485 and an inverted output signal 490. The output and inverted output signals are also coupled to the beginning delay stage as shown. By crossing the output and inverted output signals as shown, an oscillating output can be generated from an even number of delay stages.

Figure 5:
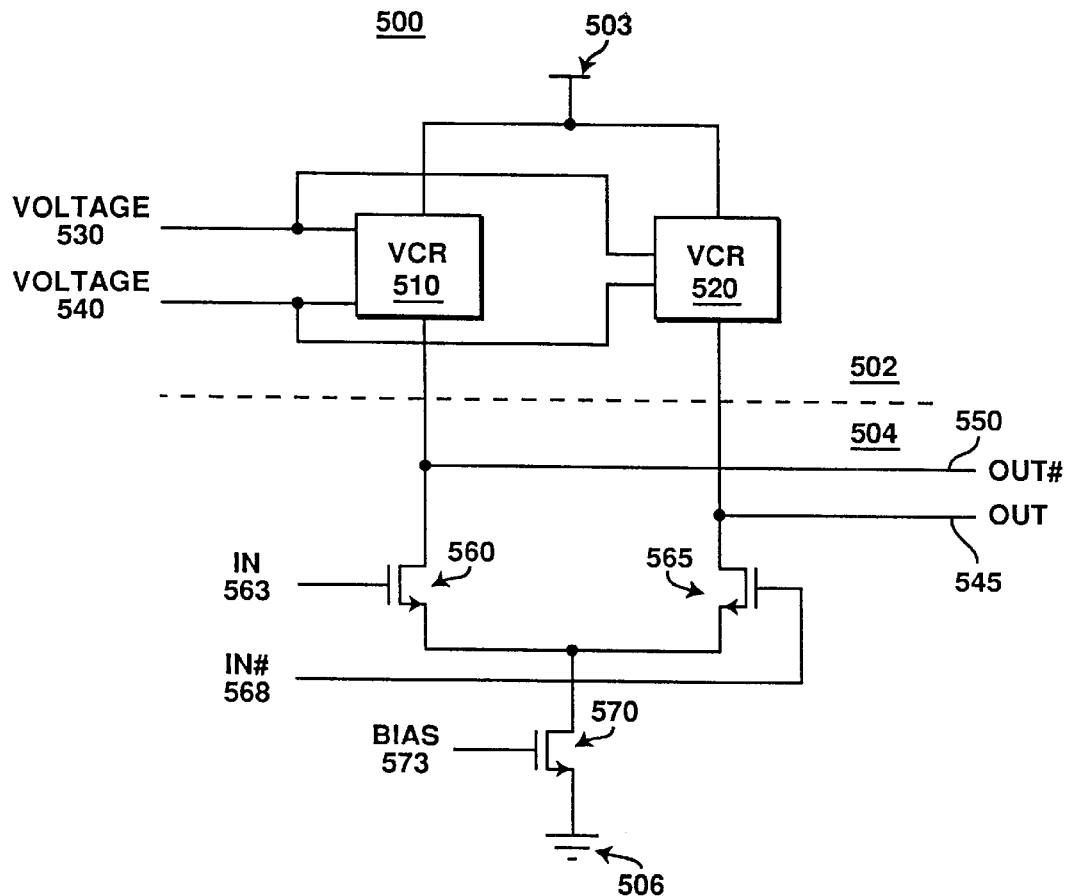
FIG. 5 is a schematic diagram of a delay stage according to one embodiment of the present invention.

FIG. 5 is a schematic diagram of a delay stage according to one embodiment of the present invention. In one embodiment of the present invention, each of the delay stages in VCO 400 and VCO 480 are a delay stage 500 of FIG. 5. It is to be appreciated that although the delay stages of the present invention are described as being used within a voltage controlled oscillator, the delay stages of the present invention can be used in any of a wide variety of devices. That is, a delay stage according to the present invention can be used in place of a delay stage or logic inverter in any conventional electronic device.

Delay stage 500 includes two portions: a voltage controlled resistance portion 502 and a signal inversion portion 504. Voltage controlled resistance portion 502 includes two voltage controlled resistors: voltage controlled resistor 510 and voltage controlled resistor 520. The resistors 510 and 520 are in parallel, as shown. Both resistors 510 and 520 receive two voltage inputs. In one embodiment of the present invention, these voltage inputs are the same; that is, voltage input 530 and voltage input 540 are the same. In an alternate embodiment of the present invention, resistor 510 and resistor 520 each receive two different voltage inputs.

Voltage controlled resistor 510 is also coupled to a voltage source 503 and the first terminal of a transistor 560. Similarly, voltage controlled resistor 520 is coupled to voltage source 503 and transistor 565. In one implementation, voltage source 503 is a 5 volt power source. However, it is to be appreciated that voltage source 503 can be any of a wide range of voltages, typically ranging from 1.2 volts–5 volts.

Signal inversion portion 504 includes three components: transistor 560, transistor 565, and transistor 570. In one embodiment of the present invention, the transistors 560, 565 and 570 are each n-channel transistors. However, it is to be appreciated that transistors 560, 565 and 570 can be any type of conventional transistor.

Transistor 560 is an n-channel transistor which has a first terminal coupled to VCR 510, a second terminal coupled to a terminal of transistor 570, and a gate terminal coupled to input signal 563. Thus, once input signal 563 exceeds a threshold voltage with respect to the voltage at the source (that is, at the first terminal), transistor 560 is turned on, allowing current to flow between the first and second terminals. Transistor 565 is an n-channel transistor which has a first terminal coupled to VCR 520, a second terminal coupled to a terminal of transistor 570, and a gate terminal coupled to inverted input signal 568. Thus, once inverted input signal 568 exceeds a threshold voltage with respect to the voltage at the source (that is, at the first terminal), transistor 565 is turned on, allowing current to flow between the first and second terminals.

Transistor 570 is an n-channel transistor which has a first terminal coupled to transistors 560 and 565, a second terminal coupled to ground source 506, and a gate terminal coupled to bias input 573. Bias input 573 is coupled to a conventional bias circuit which has an output that varies based on the control voltage input to the bias circuit. In one implementation the control voltage input to the bias circuit is voltage 360 of FIG. 3. Bias input 573 typically ranges between 0.5 and 1.0 volts.

Delay stage 500 outputs two signals: an output signal 545 and an inverted output signal 550. Output signal 550 is coupled to VCR 510 and the first terminal of transistor 560. Inverted output signal 545 is coupled to VCR 520 and the first terminal of transistor 565.

Thus, when the input signal to delay stage 500 is a logical one, IN signal 563 is a logical one and IN# signal 568 is a logical zero. This causes transistor 565 to turn off and transistor 560 to turn on. The output signal 545 is thus a logical zero because no current can flow through transistor 565. However, the inverted output signal 550 is a logical one because current can flow through transistor 560. The speed with which inverted output signal 550 transitions to a logical one is dependent on the resistance value of VCR 510. That is, the greater the resistance value, the slower the transition.

Similarly, when the input signal to delay stage 500 is a logical zero, IN signal 563 is a logical zero and IN# signal 568 is a logical one. This causes transistor 565 to turn on and transistor 560 to turn off. The inverted output signal 550 is thus a logical zero because no current can flow through transistor 560. However, output signal 545 is a logical one because current can flow through transistor 565. The speed with which output signal 545 transitions to a logical one is dependent on the resistance value of VCR 520, with smaller resistances providing faster transitions.

Figure 6:
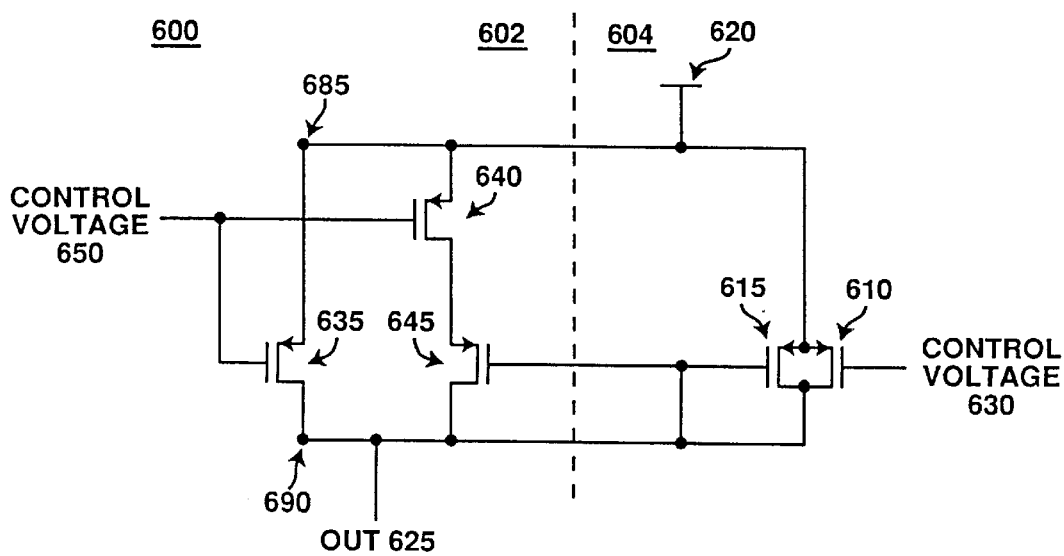
FIG. 6 is a schematic diagram showing a voltage controlled resistor according to one embodiment of the present invention.

FIG. 6 is a schematic diagram showing a voltage controlled resistor according to one embodiment of the present invention. VCR 600 includes voltage controlled resistance element 602 and voltage controlled resistance element 604. Element 604 includes two transistors: transistor 610 and transistor 615. Transistor 610 has a first terminal coupled to voltage source 620 and a second terminal coupled to output node 625. Transistor 610 also includes a gate terminal coupled to a control voltage 630. Transistor 615 includes a first terminal coupled to the first terminal of transistor 610, a second terminal coupled to output node 625, and a gate terminal coupled to output node 625.

Element 602 includes three transistors: transistor 635, transistor 640, and transistor 645. Transistor 635 has a first terminal coupled to voltage source 620, a second terminal coupled to output node 625, and a gate terminal coupled to control voltage 650. Transistor 640 includes a first terminal coupled to voltage source 620, a second terminal coupled to the first terminal of transistor 645, and a gate terminal coupled to control voltage 650. Transistor 645 includes a first terminal coupled to transistor 640, a second terminal coupled to output node 625, and a gate terminal coupled to output node 625.

Control voltage 630 and control voltage 650 are the two control voltage inputs to the VCR 600. As shown in FIG. 6, the two voltage controlled resistance elements are in parallel, and each is controlled by a different control voltage. It is known in the art that two resistances in parallel provide a total resistance according to the following calculation:

$$\frac{R_1 \cdot R_2}{R_1 + R_2}$$

where $R_1$ is the value of the first resistance and $R_2$ is the value of the second resistance. Thus, by changing either of the control voltages, the resistance provided by VCR 600 is changed. Furthermore, given limitations on the ranges of control voltages 630 and 650, different ranges of resistance can be generated for VCR 600.

For example, a single fixed voltage source can be generated as control voltage 630. Then, control voltage 650 can be allowed to vary to provide the desired frequency, as discussed above with reference to FIG. 3. Thus, with the single fixed voltage source, a first range of frequencies can be generated. Then, by changing the value of the single fixed voltage source, a second range of frequencies can be generated. Therefore, the single voltage controlled oscillator can provide a wide range of frequencies, depending on the input control voltages.

Therefore, given the different ranges which can be provided by VCR 600, a voltage controlled oscillator which uses delay stages including voltage controlled resistors according to the present invention can provide a wide range of frequencies by varying the two control voltages. In one embodiment of the present invention, a fixed control voltage and a variable control voltage are used. In one implementation, control voltage 630 is a fixed control voltage and control voltage 650 is a variable control voltage. Alternatively, control voltage 630 may be a variable control voltage and control voltage 650 may be a fixed control voltage.

In one embodiment of the present invention, the fixed control voltage is fixed at level between zero and voltage source 620. Additionally, in one embodiment the variable control voltage is adjusted in 0.2 volt steps in the PLL, ranging between zero and voltage source 620.

It is to be appreciated that although VCR 600 of FIG. 6 is shown as using p-channel transistors, the present invention is not limited to this embodiment. For example, VCR 600 could use any of a wide variety of conventional transistors, such as n-channel MOS transistors.

Figure 7:
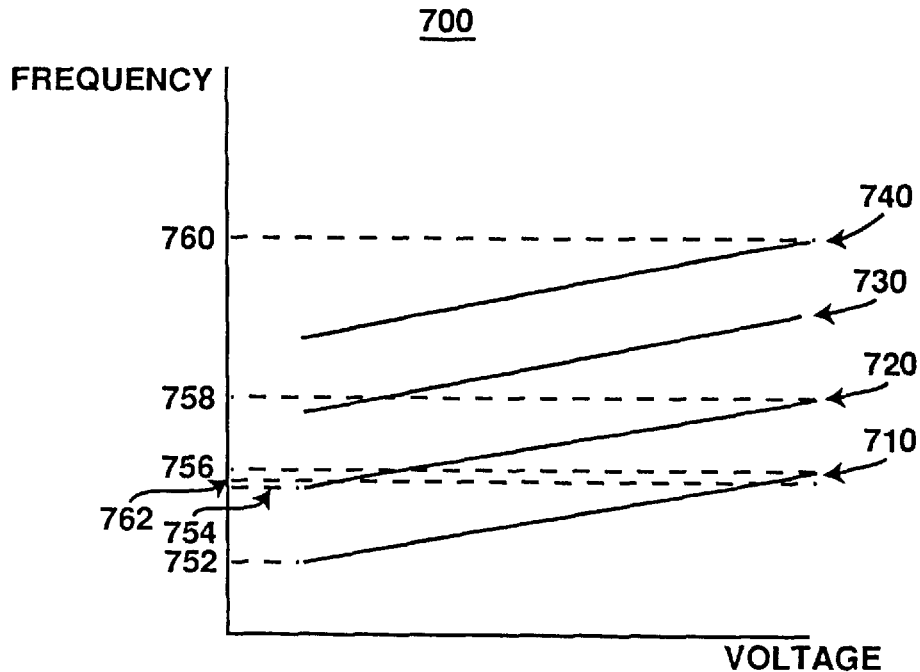
FIG. 7 shows an example of frequency ranges which can be provided by the present invention.

FIG. 7 shows an example of frequency ranges which can be provided by the present invention. FIG. 7 shows a graph 700 plotting control voltage versus oscillation frequency. Graph 700 includes four plots: plot 710, plot 720, plot 730 and plot 740. Each of the different plots represents a different fixed control voltage in a two-control voltage variable oscillator, such as one using multiple voltage controlled resistances 600 of FIG. 6. As shown in FIG. 7, a first fixed control voltage provides a range of frequencies between frequency 752 and frequency 756, as shown by plot 710. The actual frequency provided by the oscillator is dependent on the second control voltage, but will be somewhere between frequencies 752 and 756. Similarly, a second fixed control voltage provides a range of frequencies between frequency 754 and frequency 758, as shown by plot 720. Thus, the present invention provides a complete range of frequencies between frequency 752 and frequency 760 in separate sub-ranges, so that small amounts of noise in the control voltage inputs do not significantly affect the oscillation frequency.

It should be noted that, as shown in FIG. 7, the frequency ranges can overlap. For example, frequency 762 could be achieved when the fixed voltage is set for plot 710 or plot 720. In one embodiment of the present invention, the lowest possible fixed voltage is used which generates the desired oscillation frequency.

Figure 8:
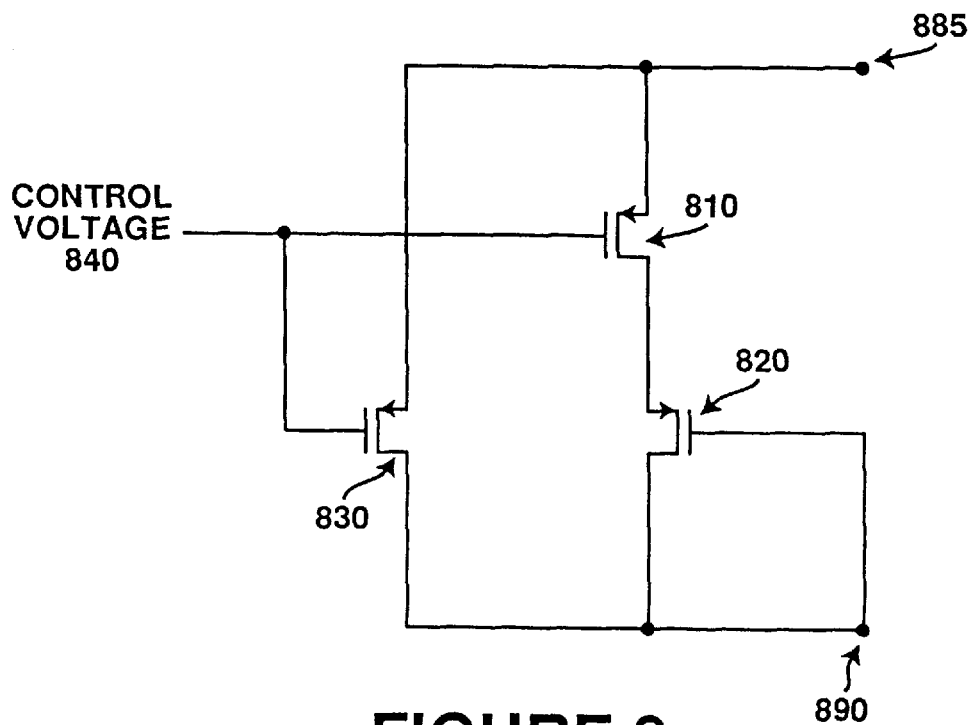
FIG. 8 is a schematic diagram showing a voltage controlled resistance element according to one embodiment of the present invention

FIG. 8 is a schematic diagram showing a voltage controlled resistance element according to one embodiment of the present invention. The voltage controlled resistance element 800 includes three transistors: transistor 810, transistor 820, and transistor 830. Transistor 810 includes a first terminal which is coupled to node 885, a second terminal which is coupled to a first terminal of transistor 820, and a gate terminal which is coupled to a control voltage 840. Transistor 820 includes a first terminal which is coupled to transistor 810, a second terminal which is coupled to node 890, and a gate terminal which is coupled to node 890. Transistor 830 includes a first terminal which is coupled to node 885, second terminal coupled to node 890, and a gate terminal coupled to control voltage 840.

Voltage controlled resistance element 800 is designed to be coupled to voltage controlled resistor 600 of FIG. 6. Element 800 is coupled to resistor 600 by coupling together node 885 of element 800 and node 685 of resistor 600. Similarly, node 890 of element 800 is coupled to node 690 of resistor 600. Thus, element 800 is placed in parallel with elements 602 and 604 of FIG. 6. In one embodiment of the present invention, control voltage 630, control voltage 650 and control voltage 840 are separate voltages. In an alternate embodiment, one or more of these control voltages are tied together. In an alternate embodiment of the present invention, additional resistance elements are coupled to VCR 600 of FIG. 6. In this alternate embodiment, any number of additional voltage controlled resistance elements can be coupled to the voltage controlled resistance elements of VCR 600 in parallel. In one implementation, these additional elements are the same as voltage controlled resistance element 800 of FIG. 8.

Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims, which in themselves recite only those features regarded as essential to the invention.

Thus, parallel voltage controlled resistance elements have been described.

What is claimed is:

1. A delay device comprising:
   a voltage controlled resistance portion to provide a variable delay, the voltage controlled resistance portion including a first voltage controlled resistance element which provides a first variable resistance based on a first variable voltage input which is variable over a first plurality of positive voltage levels, a second voltage controlled resistance element which provides a second variable resistance based on a second variable voltage input which is at a different positive voltage level than the first variable voltage input and which is variable over a second plurality of positive voltage levels, and a third voltage controlled resistance element which provides a third variable resistance based on a third variable voltage input which is at a different positive voltage level than either the first variable voltage input or the second variable voltage input and which is variable over a third plurality of positive voltage levels, the first, second, and third voltage controlled resistance elements being coupled together in parallel to provide the variable delay, the first voltage controlled resistance element being coupled to a voltage source and including a first transistor and a second transistor, and wherein a gate terminal of the first transistor is coupled to the first variable voltage input, the second voltage controlled resistance element being coupled to the voltage source and including a third transistor, a fourth transistor, and a fifth transistor, wherein a gate terminal of the third transistor and a gate terminal of the fourth transistor are both coupled to the second variable voltage input, and wherein a gate terminal of the fifth transistor of the second voltage controlled resistance element is coupled to a gate terminal of the second transistor of the first voltage controlled resistance element, and wherein the third voltage controlled resistance element includes a sixth transistor and a seventh transistor, and wherein a gate terminal of the sixth transistor is coupled to the third variable voltage input; and a signal inversion portion coupled to an input of the delay device, an output of the delay device, and the voltage controlled resistance portion.

2. A voltage controlled oscillator comprising: a plurality of delay devices, each including, a voltage controlled resistance portion to provide a variable delay, the voltage controlled resistance portion including a first voltage controlled resistance element which provides a first variable resistance based on a first variable voltage input which is variable over a first plurality of positive voltage levels, a second voltage controlled resistance element which provides a second variable resistance based on a second variable voltage input which is at a different positive voltage level than the first variable voltage input and which is variable over a second plurality of positive voltage levels, and a third voltage controlled resistance element which provides a third variable resistance based on a third variable voltage input which is at a different positive voltage level than either the first variable voltage input or the second variable voltage input and which is variable over a third plurality of positive voltage levels, the first, second, and third voltage controlled resistance elements being coupled together in parallel to provide the variable delay, the first voltage controlled resistance element being coupled to a voltage source and including a first transistor and a second transistor, and wherein a gate terminal of the first transistor is coupled to the first variable voltage input, the second voltage controlled resistance element being coupled to the voltage source and including a third transistor, a fourth transistor, and a fifth transistor, and wherein a gate terminal of the third transistor and a gate terminal of the fourth transistor are both coupled to the second variable voltage input, and wherein a gate terminal of the fifth transistor of the second voltage controlled resistance element is coupled to a gate terminal of the second transistor of the first voltage controlled resistance element, and wherein the third voltage controlled resistance element includes a sixth transistor and a seventh transistor, and wherein a gate terminal of the sixth transistor is coupled to the third variable voltage input; and a signal inversion portion coupled to an input of the delay device, an output of the delay device, and the voltage controlled resistance portion.

3. The delay device of claim 1, wherein the voltage controlled resistance portion further includes a fourth voltage controlled resistance element coupled in parallel to the first, second, and third voltage controlled resistance elements.

4. The delay device of claim 3, wherein the fourth voltage controlled resistance element provides a fourth variable resistance based on a fourth variable voltage input which is at a different positive voltage level than any of the first variable voltage input, the second variable voltage input, the third variable voltage input, and which is variable over a fourth plurality of positive voltage levels.

5. The voltage controlled oscillator of claim 2, wherein the voltage controlled resistance portion further includes:

a fourth voltage controlled resistance element coupled in parallel to the first, second, and third voltage controlled resistance elements.

6. The voltage controlled oscillator of claim 5, wherein the fourth voltage controlled resistance element provides a fourth variable resistance based on a fourth variable voltage input which is at a different positive voltage level than any of the first variable voltage input, the second variable voltage input, and the third variable voltage input, and which is variable over a fourth plurality of positive voltage levels.

* * * * *